United States Patent [19]

Ehmke

[11] Patent Number: 5,536,680
[45] Date of Patent: Jul. 16, 1996

[54] SELF-ALIGNED BUMP BOND INFRARED FOCAL PLANE ARRAY ARCHITECTURE

[75] Inventor: John C. Ehmke, Mesquite, Tex.

[73] Assignee: Texas Instruments Incorporated, Dallas, Tex.

[21] Appl. No.: 437,614

[22] Filed: May 8, 1995

[51] Int. Cl.⁶ ..................................... H01L 21/44
[52] U.S. Cl. .................. 437/188; 437/3; 437/134; 437/137; 437/202
[58] Field of Search ..................... 437/3, 5, 134, 437/137, 188, 202; 257/435, 437, 442, 448, 614

[56]  References Cited

U.S. PATENT DOCUMENTS

| 4,521,798 | 6/1985 | Baker ........................... 257/442 |
| 4,956,304 | 9/1990 | Cockrum et al. ................. 437/5 |
| 5,034,794 | 7/1991 | Murotani ........................ 257/458 |
| 5,144,138 | 9/1992 | Kinch et al. .................... 257/442 |
| 5,146,297 | 9/1992 | Collins et al. .................. 257/435 |
| 5,188,970 | 2/1993 | York et al. ...................... 437/5 |
| 5,285,098 | 2/1994 | Borrello ......................... 257/448 |
| 5,298,733 | 3/1994 | Ehmke et al. .................... 257/435 |
| 5,329,112 | 7/1994 | Mihara .......................... 257/435 |
| 5,370,301 | 12/1994 | Belcher et al. ................. 228/180.22 |
| 5,412,242 | 5/1995 | Cahen et al. .................... 257/442 |

FOREIGN PATENT DOCUMENTS 3-44071  2/1991  Japan ............................. 257/435
4-218964 8/1992  Japan ............................. 257/435

Primary Examiner—Kevin M. Picardat
Attorney, Agent, or Firm—René E. Grossman; Richard L. Donaldson

[57]  ABSTRACT

A method of making a diode and the diode wherein there is provided a substrate of p-type group II–VI semiconductor material and an electrically conductive material capable of forming an ohmic contact with the substrate is forced into the lattice of the substrate to create an n-type region in the substrate in contact with the material and forming an electrical contact to the p-type region of said substrate. The substrate is preferably HgCdTe and the electrically conductive material is preferably tungsten or tin coated tungsten or tungsten coated with a mercury amalgam. Also a method of making an infrared focal plane array and the array wherein there is provided a semiconductor integrated circuit having electrically conductive pads on a surface thereof, forming bumps of an electrically conductive material on predetermined ones of the pads, providing a substrate of p-type group II–VI semiconductor material, disposing a layer of bonding material over one of the surface of the integrated circuit containing the pads or a surface of the substrate, forcing the bumps into the lattice of the substrate to create an n-type region in the substrate in contact with the material, bonding the substrate to the integrated circuit and forming an electrical connection between the p-type region of the substrate and one of the pads. The process is otherwise the same as the diode fabrication.

12 Claims, 1 Drawing Sheet

SELF-ALIGNED BUMP BOND INFRARED FOCAL PLANE ARRAY ARCHITECTURE

BACKGROUND OF THE INVENTION

1. Field of the Invention

This invention relates to a method and structure for fabrication of infrared focal plane arrays (IRFPAs) with high quality photodiodes.

2. Brief Description of the Prior Art

Prior art techniques for fabrication of infrared focal plane arrays have utilized planar processing (VIP, vertical diodes) and bump bonded techniques (BLIMP, DLHJ). The planar processing is more appropriate for mass manufacturing techniques, however temperature restrictions after hybridization prevent use of preferable passivation methods. Bump bond techniques require difficult aligned hybridization with extremely tight mechanical tolerances. The bump bond techniques generally do not permit thinning and are not stable to temperature cycling, especially with large area formats. Both planar processing and bump bonded techniques display long process flows. It follows that a simpler process flow that can provide the same or similar results will provide an economic advantage.

SUMMARY OF THE INVENTION

In accordance with the present invention, there is provided a very rapid, simple and highly manufacturable fabrication process for IRFPAs with high quality photodiodes.

Briefly, in accordance with the present invention, advantage is taken of the property whereby vacancy doped or mobile extrinsic dopants in mercury cadmium telluride, preferably gold doped p-type mercury cadmium telluride (HgCdTe), when damaged in the lattice, forms an n-type region in the vicinity of the damage, thereby forming a diode with the adjacent p-type region. Accordingly, in accordance with the present invention, photodiodes are formed in the HgCdTe by pressing a surface of the HgCdTe against a readout integrated circuit with a damage creating feature on the surface of the integrated circuit, such as an electrically conductive bump that preferably also forms an ohmic contact with the HgCdTe. The bumps, which are preferably of tungsten or tin coated tungsten or tungsten coated with a mercury amalgam that will give up the mercury to the surrounding HgCdTe under conditions of elevated temperature or the like, are disposed on the surface of the readout integrated circuit and contact the surface of HgCdTe under pressure and preferably elevated temperature, in the range of 100° to 140° C., preferably about 110° C., to damage the surface of the HgCdTe in the immediate vicinity of the contact. The damaged area of the HgCdTe is thereby converted from p-type to n-type to provide a diode. Thereby, ohmic contact as well as conductivity type conversion and diode formation is provided at the region of the damage on the HgCdTe surface in a single step. By arranging damage creating or inducing elements, such as electrically conductive bump contacts, preferably having a sharp edge which first contacts the HgCdTe surface, on the surface of the integrated circuit in an appropriate pattern, a pattern of diodes is formed in the HgCdTe with a conductor therefrom directly to the readout integrated circuit. Bumps can be formed, for example, in accordance with the procedures as set forth in "Physical properties of thin-film field emission cathodes with molybdenum cones", *Journal of Applied Physics*, Vol. 47, No. 12, December 1976, pp 5248–51 and the references cited therein. The created bondline also allows the HgCdTe to be thinned to allow temperature cycling to 77° K. without damage with retention of most of the advantages of planar processing. Furthermore, the architecture of the present invention is amenable to both staring and scanning IRFPAs.

DESCRIPTION OF THE PREFERRED EMBODIMENT

Figure 1:
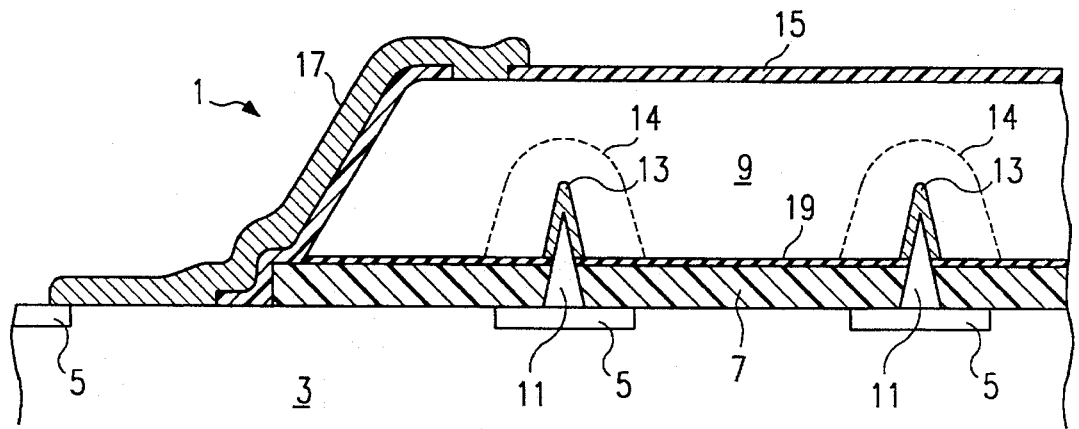
FIG. 1 is a schematic diagram of an infrared focal plane array in accordance with the present invention.

Referring first to FIG. 1, there is shown an IRFPA 1 in accordance with the present invention. The IRFPA includes a processor 3 disposed in a semiconductor chip and having pads 5 for external connection. Disposed over the processor 3 is an epoxy bondline 7 which secures the processor to a HgCdTe substrate 9 having a cadmium telluride passivation layer 19 at the surface thereof opposing the processor. Electrically conductive spikes or bumps 11 are disposed on each of the pads 5 which corresponds to a detector pixel of the array, some of the pads 5 being available for connection to conductors other than the spikes. The region 13 of the substrate 9 around the spike which has been damaged due to entry of the spike 11 into the substrate as well as a region 14 in close proximity to the damage is converted from p-type to n-type due to the damage whereas the remainder of the substrate remains p-type. A standard antireflective coating 15 is disposed over the substrate 9 and includes vias therein for a conductor 17 which coupled the p-type portion of the substrate to the processor 3 via a pad 5 which is not associated with a pixel.

Figure 2A:
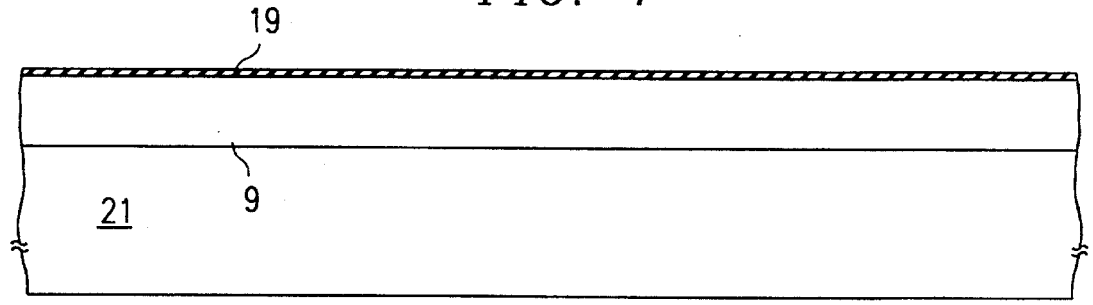
FIGS. 2a to 2c are a process flow to fabricate the infrared focal plane array of FIG. 1.

A process flow for fabrication of the IRFPA of FIG. 1 would be as follows:

Referring to FIG. 2a, a substrate of CdTe 21 is provided and a layer of vacancy doped or gold doped p-type HgCdTe 9 having a thickness of at least about 20 micrometers is deposited on a surface thereof by liquid phase epitaxy (LPE) or a thick layer of HgCdTe is provided in place of substrate 21 and layer 9. A passivating layer of CdTe 19 is then deposited over the HgCdTe layer 9.

Figure 2B:
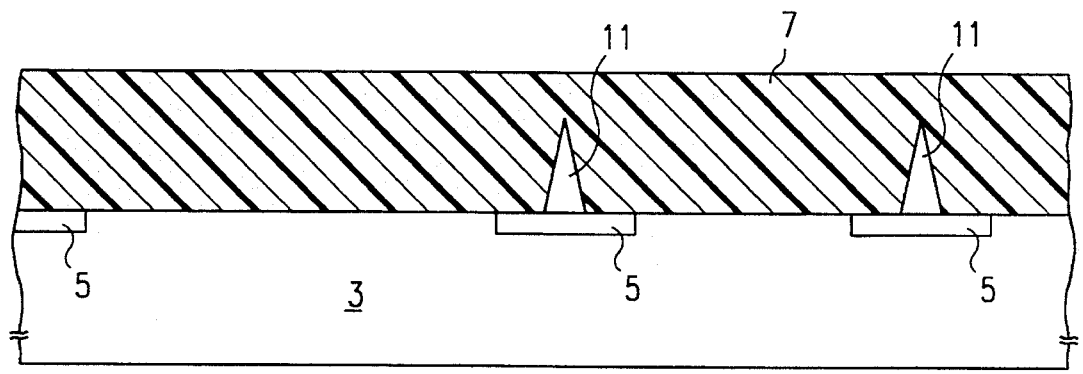

A processor in the form of an integrated circuit 3 having pads 5, some of which are associated with pixels to be formed in the HgCdTe and some of which are for other connection is provided. Electrically conductive spikes 11 which are preferably formed from tungsten which can be coated with tin or coated with mercury amalgam and which are 3 to 5 micrometers in height are then formed only on those pads 5 which are associated with a pixel and may also be in other inert locations for leveling purposes. The active surface of the processor 3 is then coated with a bonding epoxy 7 having a thickness of 75 micrometers as shown in FIG. 2b.

Figure 2C:
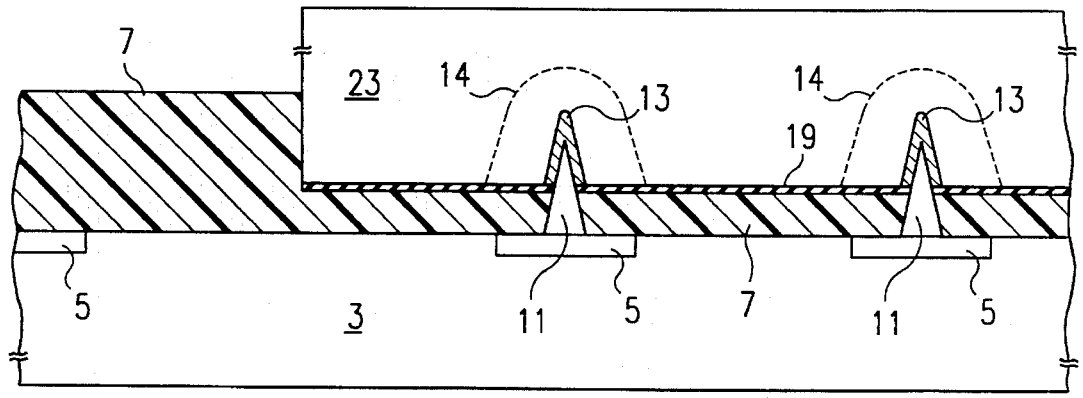

The surface of the CdTe layer 19 of FIG. 2a is then forced against the spikes 11 under pressure and elevated temperature to bond the substrate 21 to the processor 3 and cause the spikes 11 to penetrate through the passivating layer 19 and enter into the substrate 9. This causes the region 14 of the substrate 9 around the spike 11 to be converted from p-type to n-type due to the damage to the lattice caused by penetration of the spike 11 into the substrate 9 as shown in FIG. 2c.

The CdTe substrate 21 is then removed, if initially provided, or the substrate of HgCdTe is thinned to a thickness of 10 micrometers, in either case by standard mechanical and chemical-mechanical etching techniques. A standard anti-reflective coating 15 is then formed over the remaining exposed HgCdTe 9 and an aperture is formed therein to the exposed HgCdTe with metallization 17 then formed from the exposed HgCdTe, through the aperture formed in the antireflective coating to a pad 5 on the processor 3. This provides the IRFPA as shown in FIG. 1.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of making a diode comprising the steps of:
   (a) providing a substrate of p-type group II–VI semiconductor material;
   (b) forcing an electrically conductive material capable of forming an ohmic contact with said substrate into the lattice of said substrate to create an n-type region in said substrate in contact with said material; and
   (c) forming an electrical contact to the p-type region of said substrate.

2. The method of claim 1 wherein said substrate is HgCdTe.

3. The method of claim 1 wherein said electrically conductive material is tungsten.

4. The method of claim 2 wherein said electrically conductive material is tungsten.

5. The method of claim 1 wherein said electrically conductive material is one of tin coated tungsten or tungsten coated with a mercury amalgam.

6. The method of claim 2 wherein said electrically conductive material is one of tin coated tungsten or tungsten coated with a mercury amalgam.

7. A method of making an infrared focal plane array comprising the steps of:
   (a) providing a semiconductor integrated circuit having electrically conductive pads on a surface thereof;
   (b) forming bumps of an electrically conductive material on at least some of said pads;
   (c) providing a substrate of p-type group II–VI semiconductor material;
   (d) disposing a layer of bonding material over one of the surface of said integrated circuit containing said pads or a surface of said substrate;
   (e) forcing said bumps into the lattice of said substrate to create an n-type region in said substrate in contact with said material and bond said substrate to said integrated circuit; and
   (f) forming an electrical connection between the p-type region of said substrate and one of said pads.

8. The method of claim 7 wherein said substrate is HgCdTe.

9. The method of claim 7 wherein said electrically conductive material is tungsten.

10. The method of claim 8 wherein said electrically conductive material is tungsten.

11. The method of claim 7 wherein said electrically conductive material is one of tin coated tungsten or tungsten coated with a mercury amalgam.

12. The method of claim 8 wherein said electrically conductive material is one of tin coated tungsten or tungsten coated with a mercury amalgam.

* * * * *